United States Patent
Rao et al.

(10) Patent No.: US 7,432,158 B1
(45) Date of Patent: *Oct. 7, 2008

(54) METHOD FOR RETAINING NANOCLUSTER SIZE AND ELECTRICAL CHARACTERISTICS DURING PROCESSING

(75) Inventors: Rajesh A. Rao, Austin, TX (US); Tien Ying Luo, Austin, TX (US); Ramachandran Muralidhar, Austin, TX (US); Robert F. Steimle, Austin, TX (US); Sherry G. Straub, Pflugerville, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 106 days.

This patent is subject to a terminal disclaimer.

(21) Appl. No.: 11/459,843

(22) Filed: Jul. 25, 2006

(51) Int. Cl.
H01L 21/336 (2006.01)
H01L 21/4763 (2006.01)
H01L 21/8238 (2006.01)
H01L 21/36 (2006.01)

(52) U.S. Cl. .................. 438/264; 438/287; 438/288; 438/591; 438/593; 438/201; 438/211; 438/260; 438/479; 977/774; 977/779; 977/780; 977/943; 257/E21.423

(58) Field of Classification Search .............. 438/257, 438/287, 288, 591, 593, 201, 211, 260, 479; 257/E21.423; 977/774, 779, 780, 943
See application file for complete search history.

(56) References Cited

U.S. PATENT DOCUMENTS

| | | | |
|---|---|---|---|
| 5,830,538 A | 11/1998 | Gates et al. | |
| 6,090,666 A | 7/2000 | Ueda et al. | |
| 6,127,696 A * | 10/2000 | Sery et al. | 257/207 |
| 6,297,095 B1 * | 10/2001 | Muralidhar et al. | 438/257 |
| 6,320,784 B1 | 11/2001 | Muralidhar et al. | |
| 6,339,002 B1 | 1/2002 | Chan et al. | |
| 6,344,403 B1 | 2/2002 | Madhukar et al. | |
| 6,413,819 B1 | 7/2002 | Zafar et al. | |
| 6,444,545 B1 | 9/2002 | Sadd et al. | |
| 6,455,372 B1 | 9/2002 | Weimer | |
| 6,580,132 B1 | 6/2003 | Chan et al. | |
| 6,656,792 B2 | 12/2003 | Choi et al. | |
| 6,713,127 B2 | 3/2004 | Subramony et al. | |

(Continued)

OTHER PUBLICATIONS

American Heritage Dictionary, around, from Dictionary.com.*

(Continued)

*Primary Examiner*—Michelle Estrada
*Assistant Examiner*—Kevin A Parendo
(74) *Attorney, Agent, or Firm*—Robert L. King; James L. Clingan, Jr.

(57) ABSTRACT

A method of making a semiconductor device includes a substrate having a semiconductor layer having a first portion for non-volatile memory and a second portion exclusive of the first portion. A first dielectric layer is formed over the semiconductor layer. A first plurality of nanoclusters is formed over the first portion and a second plurality of nanoclusters is formed over the second portion. A layer of nitrided oxide is formed around each nanocluster of the first plurality and the second plurality of nanoclusters. Remote plasma nitridation is performed on the layers of nitrided oxide of the first plurality of nanoclusters. The nanoclusters are removed from the second portion. A second dielectric layer is formed over the semiconductor layer. A conductive layer is formed over the second dielectric layer.

19 Claims, 8 Drawing Sheets

U.S. PATENT DOCUMENTS

| | | | |
|---|---|---|---|
| 6,784,103 | B1 | 8/2004 | Rao et al. |
| 6,808,986 | B2 | 10/2004 | Rao et al. |
| 6,884,685 | B2 | 4/2005 | Luo et al. |
| 6,903,967 | B2 | 6/2005 | Mathew et al. |
| 6,946,346 | B2 * | 9/2005 | Chae et al. ............... 438/257 |
| 6,949,455 | B2 | 9/2005 | Pham et al. |
| 6,958,265 | B2 | 10/2005 | Steimle et al. |
| 6,964,902 | B2 | 11/2005 | Steimle et al. |
| 6,969,883 | B2 | 11/2005 | Chindalore et al. |
| 6,991,987 | B1 * | 1/2006 | Guo et al. ............... 438/264 |
| 7,012,298 | B1 | 3/2006 | Krivokapic |
| 7,015,090 | B2 | 3/2006 | Okazaki et al. |
| 2004/0043583 | A1 | 3/2004 | Rao et al. |
| 2004/0104425 | A1 * | 6/2004 | Kobayashi et al. ......... 257/321 |
| 2004/0106285 | A1 | 6/2004 | Zacharias |
| 2004/0130941 | A1 | 7/2004 | Kan et al. |
| 2004/0135204 | A1 | 7/2004 | Wang et al. |
| 2004/0150024 | A1 | 8/2004 | Mazoyer et al. |
| 2004/0212019 | A1 | 10/2004 | Shinohara et al. |
| 2005/0014335 | A1 | 1/2005 | Goldbach et al. |
| 2005/0029572 | A1 * | 2/2005 | Schmitz ................ 257/314 |
| 2005/0037574 | A1 * | 2/2005 | Sugiyama ............... 438/257 |
| 2005/0090062 | A1 * | 4/2005 | Wang ................... 438/264 |
| 2005/0098822 | A1 | 5/2005 | Mathew et al. |
| 2005/0287729 | A1 | 12/2005 | Steimle |
| 2006/0105522 | A1 | 5/2006 | Steimle et al. |
| 2006/0110883 | A1 * | 5/2006 | Min .................... 438/260 |
| 2007/0034142 | A1 * | 2/2007 | Pescini et al. ............ 117/89 |
| 2007/0202708 | A1 * | 8/2007 | Luo et al. ............... 438/758 |

OTHER PUBLICATIONS

U.S. Appl. No. 11/376,410, filed Mar. 15, 1006.
U.S. Appl. No. 11/376,411, filed Mar. 15, 1006.
U.S. Appl. No. 10/876,820, filed Jun. 25, 2004.
Puglisi et al, "Partial self-ordering observed in silicon nanoclusters deposited on silicon oxide substrate by chemical vapor deposition",Surface Science, 550 (2004), pp. 1-9.
Leach et al., "Cracking Assisted Nucleation in Chemical Vapor Deposition on Silicon Dioxide," Journal of Crystal Growth, (2002) vol. 240, No. 3-4, pp. 415-422.
Hu et al., "Real Time Investigation of Nucleation and Growth of Silicon on Silicon Dioxide Using Silane and Disilane in a Rapid Thermal Processing System," J. Vac. Sci. Technol. B 14(2), Mar./Apr. 1996, pp. 744-750.
De Blauwe et al., "A Novel, Aerosol-Nanocrystal Floating-Gate Device for Non-Volatile Memory Applications," Electron Devices Meeting 2000, IEDM Technical Digest. International, pp. 683-686.
Kamins, "Polycrystalline Silicon for Integrated Circuits and Displays," 2nd Edition, Kluwer Academic Publishers, 1998, Boston, p. 44.
Madhukar et al., "CVD Growth of Si Nanocrystals on Dielectric Surfaces for Noncrystal Floating Gate Memory Application," Materials Research Society Proc. vol. 638, 2001 Materials Research Society, pp. F5.2.1-F5.3.1.
Baron et al., "Growth by Low Pressure Chemical Vapor Deposition of Silicon Quantum Dots on Insulator for Nanoelectronics Devices," Materials Research Society Sumposium Proc. vol. 571, 2000 Materials Research Society, pp. 37-42.
Qin et al., "Observation of Coulomb-Blockade in a Field-Effect Transistor With Silicon Nanocrystal Floating Gate at Room Temperature," Solid State Communications 111, 1999, pp. 171-174.
Mazen F. et al., "Control of Silicon Quantum Dots Nucleation and Growth by CVC," Materials Research Society, Symposium Procedures, vol. 737, pp. F1.9.1-F1.9.6 (2003).
Oishi, Masato et al, "Fabrication of Silicon Nano-Crystal Dots on SiO2 by Ultrahigh-Vacuum Chemical apor Deposition," Materials Research Society, Symposium Procedures, vol. 638, 3 pgs. (2001).
Ranade et al.; "Work Function Engineering of Molybdenum Gate Electrodes by Nitrogen Implantation"; Electrochemical and Solid-State Letters; G85-G87; 2001.
Zhu, Jane G. et al.; "Effects of Ion Beam Mixing on the Formation of SiGe Nanocrystals by Ion Implantation"; Proceedings of the 11th International Conference on Ion Implantation Technology; Jun. 16-21, 1996; 1 pg abstract & pp. 690-693; IEEE; USA.
Kim, Dong-Won; "Charge retention characteristics of SiGe quantum dot flash memories"; Conference Digest, Device Research Conference; 2002; 1 pg. abstract & pp. 151-152; IEEE; USA.
Cavins et al., "A Nitride-Oxide Blocking Layer for Scaled SONOS Non-Volatile Memory," Motorola, Inc., Jan. 10, 2002, 5 pages.
Cavins et al., "Integrated Stacked Gate Oxide and Interpoly Oxide," Motorola, Inc.,, Nov. 1996, pp. 93-94.
Wolf, Ph.D., S.; "Endpoint-Detection in CMP"; Silicon Processing for the VLSI Era; Title pg & pp. 385-387; vol. 4; Deep Submicron Process Technology; Lattice Press, Sunset Beach,CA, no date.
Solomon, P.M. et al.; "Two Gates Are Better Than One"; IEEE Circuits & Devices Magazine; Jan. 2003; pp. 48-62; IEEE.
Blosse, A.; "PVD Aluminum Dual Damascene Interconnection: Yield Comparison between Counterbore and Self Aligned Approaches"; IITC; 1999; pp. 215-218; IEEE.
Lai, "Tunnel Oxide and ETOXTM Flash Scaling Limitation," IEEE 1998 Int'l Nonvolatile Memory Technology Conference, pp. 6-7.
Huang, Shaoyun et al; "Toward Long-Term Retention-Time Single-Electron-Memory Devices Based on Nitrided Nanocrystalline Silicon Dots"; IEEE Transactions on Nanotechnology; Mar. 2004; pp. 210-214; vol. 3 No. 1; IEEE.

\* cited by examiner

US 7,432,158 B1

METHOD FOR RETAINING NANOCLUSTER SIZE AND ELECTRICAL CHARACTERISTICS DURING PROCESSING

RELATED APPLICATION

The present invention relates to a co-pending application entitled "Method for Removing Nanoclusters From Selected Regions", U.S. Ser. No. 11/459,837, which was filed of even date herewith and is assigned to the same assignee as the present application.

FIELD OF THE INVENTION

The present invention relates generally to methods of forming semiconductor devices, and more particularly to semiconductor processes for forming nanoclusters or silicon dots.

BACKGROUND OF THE INVENTION

When silicon dots or nanoclusters are formed in a data storage portion of an integrated circuit, the nanoclusters that are deposited need to be preserved during subsequent processing. Typically, further processing often includes exposure to highly oxidizing ambients that can degrade or consume the nanocrystals. It is necessary to preserve the physical and electrical characteristics of nanocrystals during subsequent processing. A plasma nitridation of silicon dots has been proposed for long-term memory device retention time. However, the levels of nitrogen incorporated by nitridation of silicon are not high enough to serve as a robust oxidation barrier. Significant oxidation of the surface of a silicon dot makes the silicon dot very difficult to erase.

During deposition nanoclusters of differing sizes and shapes are formed. Some deposited nanoclusters are much larger than others while others are oblong in shape. Even with tight nanocluster processing control that results in a narrow dispersion of cluster sizes, the presence of a few substantially larger clusters in the peripheral area is not statistically insignificant. When nanoclusters are deposited on a thin oxide surface, a long wet etch or dry etch is required to remove those nanoclusters which are substantially larger than the mean size. Such a long wet etch or a dry etch will often compromise the integrity of devices built in the peripheral areas. For example, such etches will unintentionally remove portions of layers in the peripheral areas which are not desired or intended to be removed. A typical example is the recess of the trench isolation oxide and its concomitant problems. A long wet etch or dry etch therefore compromises the integrity of devices built in the peripheral areas. Selective removal of nanoclusters is therefore problematic.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Figure 1:
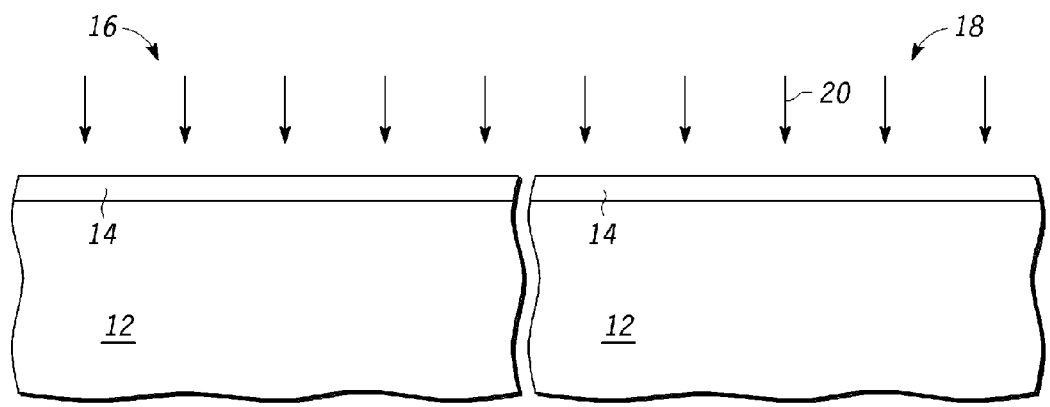
FIGS. 1 and 2 illustrate in cross-sectional form initial processing of a semiconductor device in accordance with various embodiments of the present invention.

FIG. 1 illustrates a semiconductor device 10 having a substrate 12. The substrate 12 may be formed of various semiconductor materials such as germanium or bulk silicon. Overlying the substrate 12 is a gate dielectric layer 14. The gate dielectric layer 14 is conventionally formed as an oxide layer but other dielectrics may be used. Within the semiconductor device 10 are regions where nanoclusters are desired. Typically such regions are for memory storage devices such as a nonvolatile memory (NVM). In one form an NVM region 16 and a non-NVM region 18 are illustrated and are separated by a gap. It should be understood that conventional shallow trench isolation (STI) structures may be used to separate the nonvolatile memory region 16 from the non-NVM region 18. Additionally, devices to be formed within each of these regions are electrically separated by STI structures which are not shown. The semiconductor device 10 is subjected to a plasma nitridation 20 preferably with the plasma source being separated from the semiconductor substrate 12. The separation that is used makes the source of the plasma energy to be removed from or remote to the semiconductor device being processed. This type of plasma nitridation therefore may be referred to as remote plasma nitridation. It is also desired to have the ability to independently control the density and energy of the bombarding nitrogen ions. Typically, this is achieved by controlling the plasma power and pressure of the Nitrogen gas in the reactor. The plasma nitridation is used to treat the exposed surface of the gate dielectric layer 14 and create a nitrided portion at the upper portion of the gate dielectric layer 14.

Figure 2:
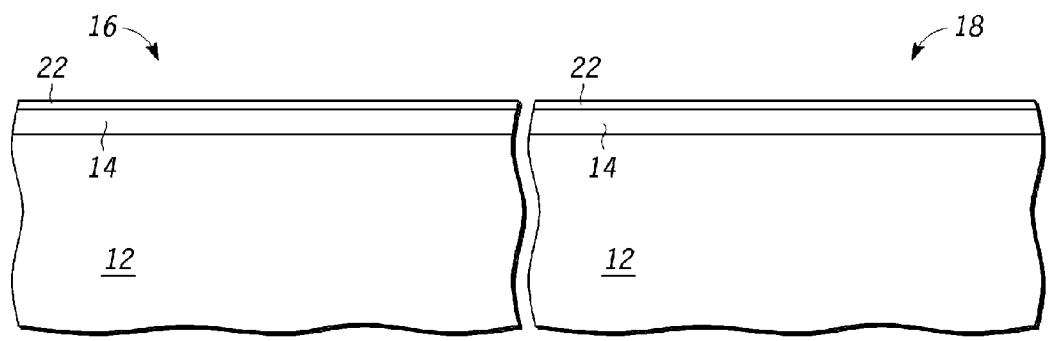

Illustrated in FIG. 2 is the semiconductor device 10 after exposure to the plasma nitridation 20. A plasma nitrided layer 22 is formed overlying the gate dielectric layer 14. The plasma nitrided layer 22 is conformal and forms a barrier at the top or upper portion of the gate dielectric layer 14. Because the plasma nitridation 20 can be accurately controlled the depth of the plasma nitrided layer 22 can also be formed to an accurate predetermined depth and nitrogen concentration. Typically the nitrogen concentration is between five and ten percent. However, other nitrogen ranges are possible.

Figure 3:
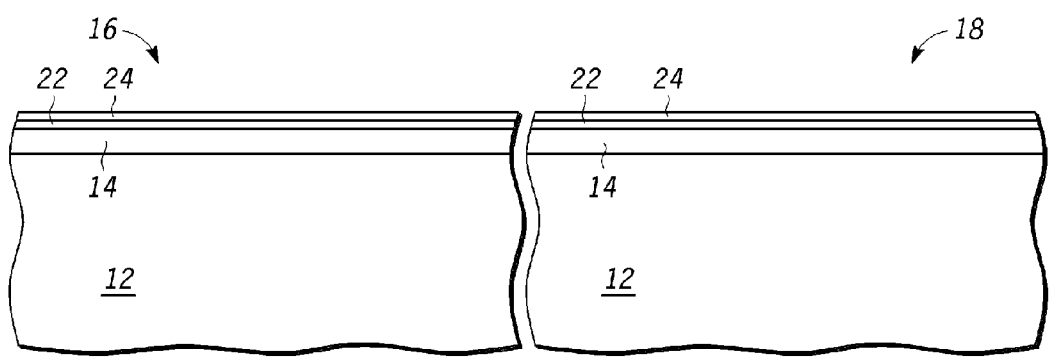
FIGS. 3-10 illustrate in cross-sectional form further processing from FIG. 2 of a semiconductor device in accordance with one form of the present invention.

Illustrated in FIG. 3 is further processing of semiconductor device 10 that represents a method associated with one embodiment in the formation of semiconductor device 10. Overlying the plasma nitrided layer 22 is a conformal sacrificial layer 24 which results from surface oxidation of the plasma nitrided layer 22. Alternatively, the surface of the plasma nitrided layer 22 is exposed to an oxygen plasma of lower energy to reoxidize the surface and form the sacrificial layer 24 as an oxide. This sacrificial layer 24 is a thin layer and as will be discussed below serves to float off nanoclusters when wet etched. Therefore, the sacrificial layer 24 is later used in a sacrificial manner.

Figure 4:
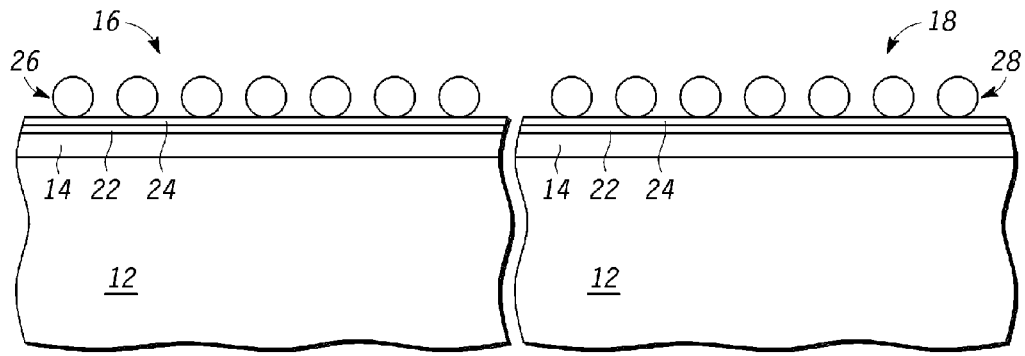

Illustrated in FIG. 4 is further processing of semiconductor device 10 in which nanoclusters have been formed. Typically the nanoclusters are formed by low pressure chemical vapor deposition (LPCVD) or by recrystallization of a deposited amorphous layer. The nanoclusters commonly used in memory devices are formed of silicon and thus are sometimes referred to in the literature as silicon dots. The nanoclusters that are formed in the NVM region 16 are referenced as nanoclusters 26. The nanoclusters that are formed in the non-NVM region 18 are referenced as nanoclusters 28. Typically the nanoclusters are between about 3 and 15 nm in diameter.

Figure 5:
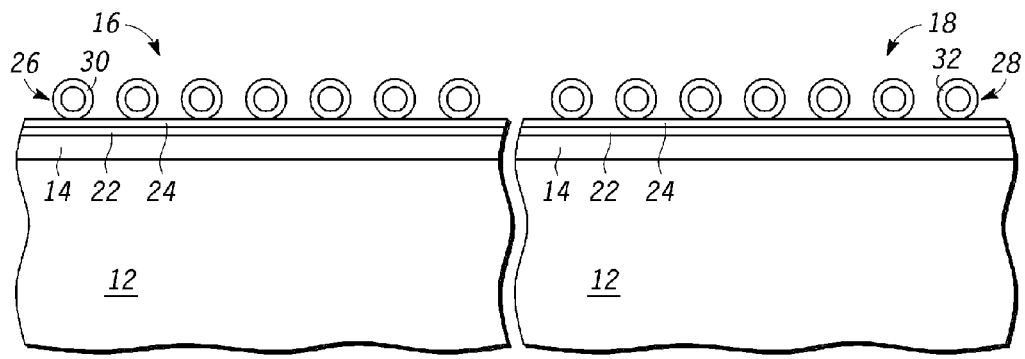

Illustrated in FIG. 5 is further processing of semiconductor device 10 in which the nanoclusters are subjected to an oxidizing ambient containing nitrous oxide [NO] at around 800 to 900 degrees Celsius. This forms a thin oxide shell containing about two percent of nitrogen ($N_2$). The oxidation process of nanoclusters in an NO ambient is more self-limiting than that in oxygen ($O_2$). This process enables one to form a nitrided oxide shell that has a dimension of between ten and fifteen Angstroms. For example, a nitrided oxide layer 30 is formed in the NVM region 16 around one of the illustrated nanoclusters. Similarly, a nitrided oxide layer 32 is formed in the non-NVM region 18 around one of the illustrated nanoclusters. This nitrided oxide shell ensures that the interface between the core of the silicon nanocluster and the surrounding nitrided oxide has minimal surface state defects. The nitrogen in the nitrided oxide shell also protects the nanoclusters when they are exposed to one or more oxidizing ambients during subsequent processing.

Figure 6:
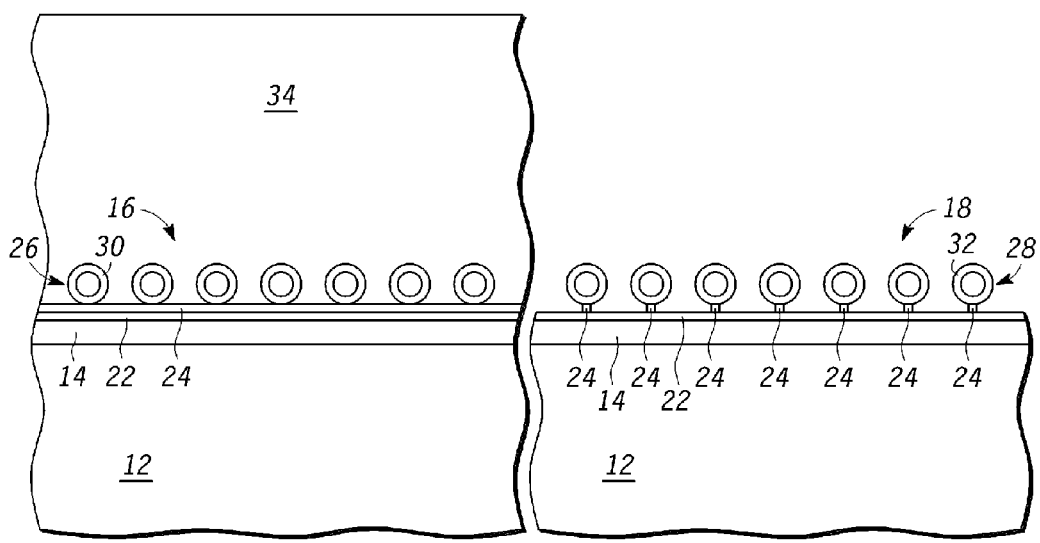

Illustrated in FIG. 6 is further processing of semiconductor device 10 in which a photoresist mask 34 is formed over the NVM region 16. Using this mask a wet etch in dilute hydrofluoric (HF) acid is performed. This etch process selectively etches the oxide layer 24 relative to a nitrogen-rich oxide layer. As shown in FIG. 6, the oxide can be etched from below the nanoclusters of the non-NVM region 18. Once etched in this manner, the nanoclusters may then be floated off and completely removed with a megasonic clean using ammonium hydroxide, hydrogen peroxide and deionized water.

Figure 7:
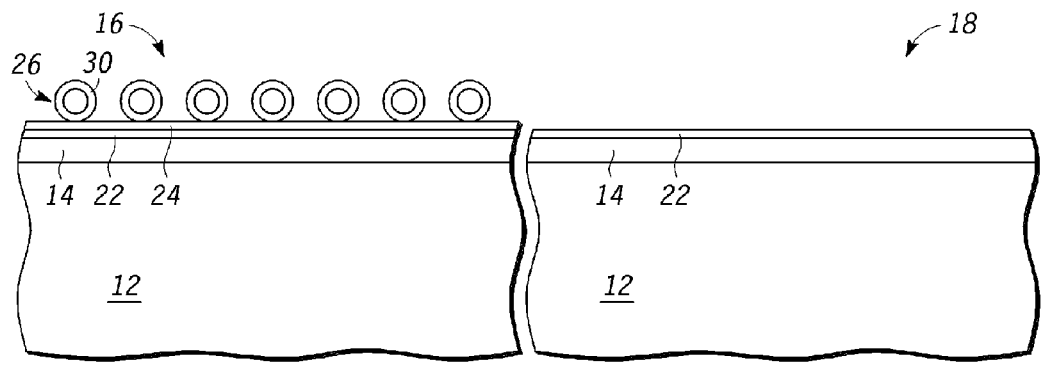

Illustrated in FIG. 7 is further processing of semiconductor device 10 in which the nanoclusters in the non-NVM region 18 have been removed. Once removed, the photoresist mask 34 is removed from above the NVM region 16.

Figure 8:
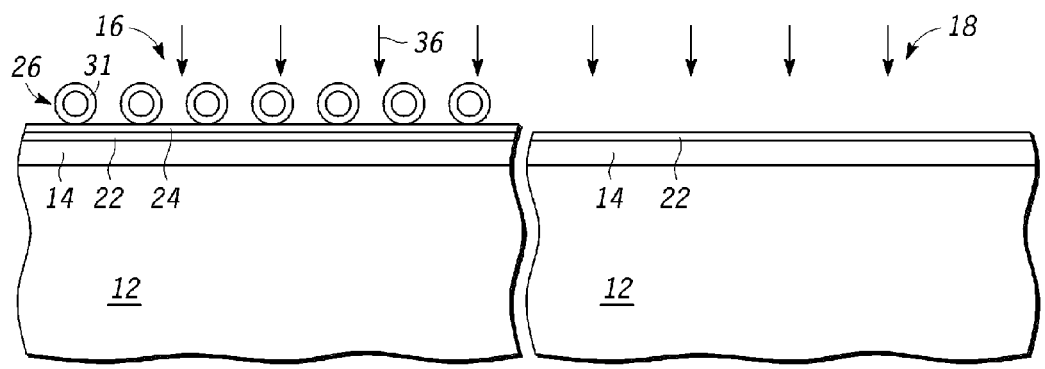

Illustrated in FIG. 8 is further processing of semiconductor device 10 in which the surface of semiconductor device 10 is exposed to plasma nitridation 36. This process nitridizes the nitrided oxide shell around the nanoclusters within NVM region 16 and changes the nitrided oxide layer 30 into a surface nitrogen enhanced layer 31. The presence of this nitrogen substantially increases the immunity of the nanoclusters in oxidizing ambients. While the nitrided oxide layer 30 typically contains one to two percent nitrogen, subsequent to the plasma nitridation 36 the nitrogen concentration near the surface of the nanoclusters can be as high as ten percent or slightly more. Typically the nitrogen concentration of the surface nitrogen enhanced layer 31 is between five percent and ten percent nitrogen. The high surface nitrogen content provides immunity against oxidation without degrading the interface between the silicon core of the nanocluster and surrounding oxide.

Figure 9:
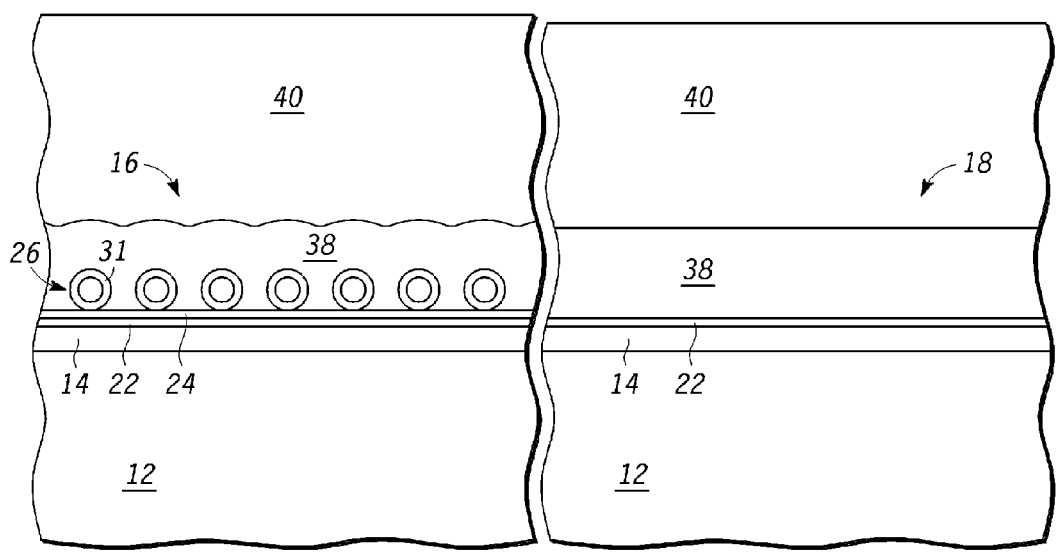

Illustrated in FIG. 9 is further processing of semiconductor device 10 in which a high temperature oxide (HTO) layer 38 is deposited to function as a control or blocking oxide layer. This HTO layer 38 is typically deposited in a low pressure CVD (Chemical Vapor Deposition) environment using silane or dichlorosilane as a precursor and a large excess of an oxidizing agent such as $N_2O$ at a temperature within a range of approximately seven hundred to eight hundred degrees Celsius. In the illustrated form the upper surface of the HTO layer 38 is conformal to the underlying nanoclusters. The nitrided shell around the nanoclusters protects the nanoclusters from being consumed during the control oxide deposition. Subsequent to the deposition of the HTO layer 38 there is deposited a thick layer of polysilicon 40. The layer of polysilicon 40 is doped with ions either by insitu doping and/or by ion implantation. The layer of polysilicon 40 is used to form the gate electrodes of transistors (not shown) in the NVM region 16.

Figure 10:
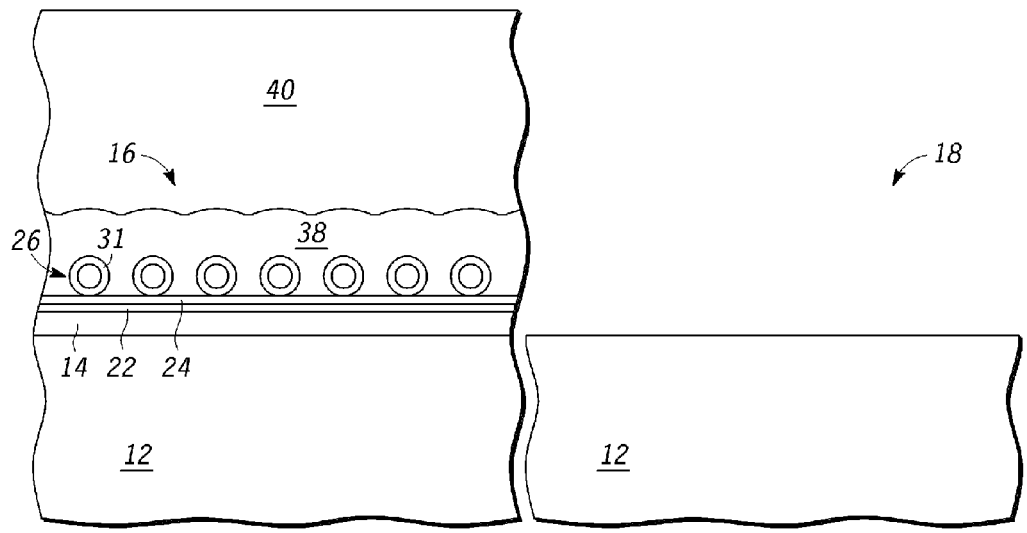

Illustrated in FIG. 10 is further processing of semiconductor device 10 in which the polysilicon 40, the HTO layer 38, the plasma nitrided layer 22 and the gate dielectric layer 14 are completely removed from the non-NVM region 18 by masking off the NVM region 16 with a mask (not shown). A combination of dry and wet etches can be readily applied. For example, the polysilicon 40 overlying the non-NVM region 18 is etched using conventional plasma or reactive ion etch (RIE) selective to oxide. The HTO layer 38 overlying the non-NVM region 18 can be removed by a wet chemistry such as dilute hydrofluoric acid. The plasma nitrided layer 22 serves as an etch stop layer during this etch step. The plasma nitrided layer 22 and gate dielectric layer 14 can be removed by wet etches since they are thin layers and will not result in degrading any trench isolation oxide. The polysilicon 40 overlying the NVM region 16 remains in place during the etch to protect the underlying layers.

Figure 11:
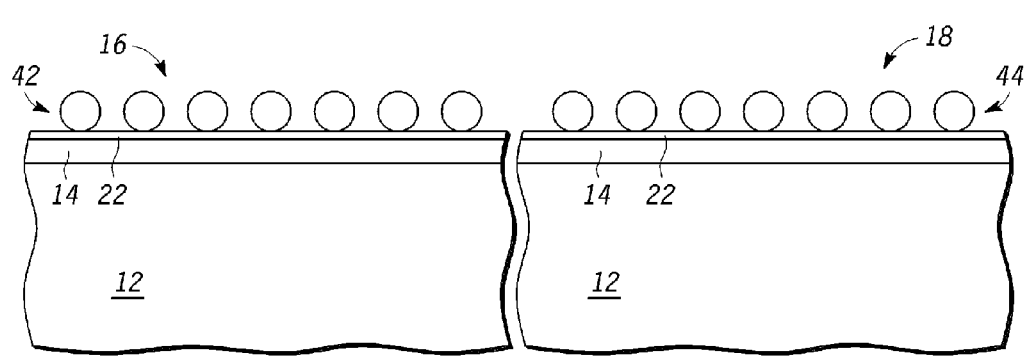
FIGS. 11-15 illustrate in cross-sectional form further processing from FIG. 2 of a semiconductor device in accordance with another form of the present invention.

Illustrated in FIG. 11 is alternate further processing of semiconductor device 10 to be performed after the processing that has been performed through the end of FIG. 2. In particular, after the formation of the plasma nitrided layer 22 nanoclusters are formed directly on the plasma nitrided layer 22. NVM nanoclusters 42 are formed in the NVM region 16 and non-NVM nanoclusters 44 are formed in the non-NVM region 18.

Figure 12:
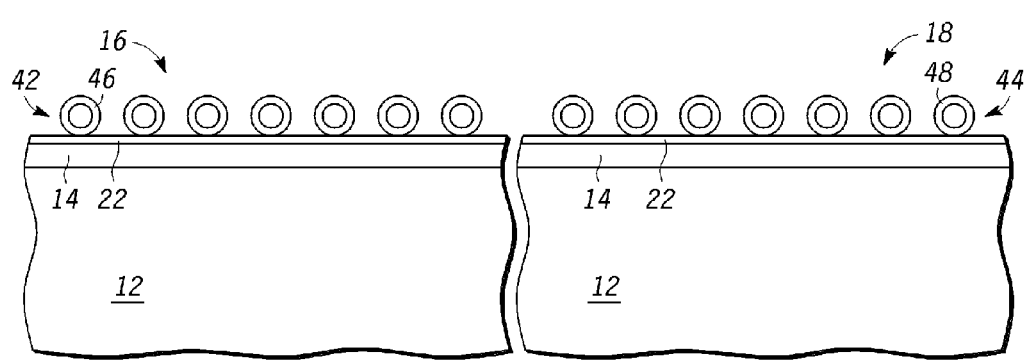

Illustrated in FIG. 12 is further processing of semiconductor device 10 of FIG. 11. In particular the nanoclusters are subjected to an oxidizing ambient containing nitrous oxide [NO] at around 800 to 900 degrees Celsius. This forms a thin oxide shell containing about two percent of nitrogen ($N_2$). The oxidation process of nanoclusters in an NO ambient is more self-limiting than that in oxygen ($O_2$). This process enables one to form a nitrided oxide shell that has a dimension of between ten and fifteen Angstroms. For example, a nitrided oxide layer 46 is formed in the NVM region 16 around one of the illustrated nanoclusters. Similarly, a nitrided oxide layer 48 is formed in the non-NVM region 18 around one of the illustrated nanoclusters. This nitrided oxide shell ensures that the interface between the core of the silicon nanocluster and the surrounding nitrided oxide has minimal surface state defects. The nitrogen in the nitrided oxide shell also protects the nanoclusters when they are exposed to oxidizing ambients during subsequent processing.

Figure 13:
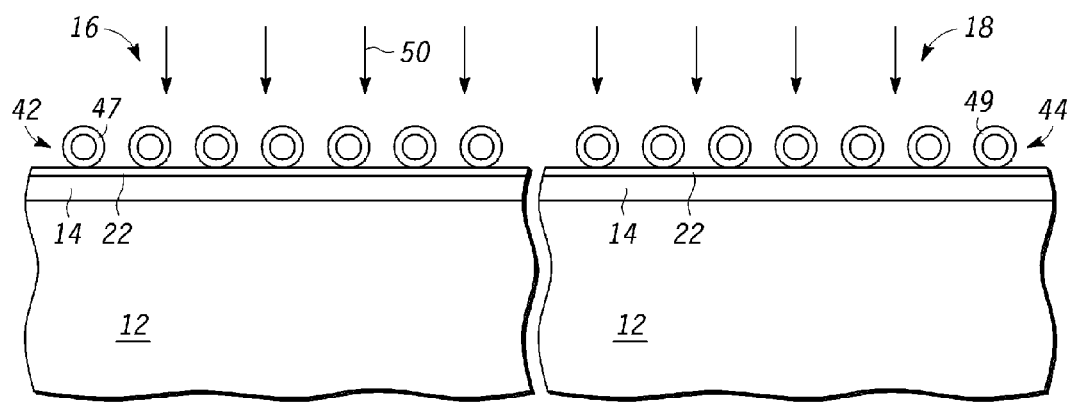

Illustrated in FIG. 13 is further processing of semiconductor device 10 of FIG. 11. The surface of semiconductor device 10 is exposed to plasma nitridation 50. This process nitridizes the nitrided oxide shell around the nanoclusters. The presence of this nitrogen substantially increases the immunity of nanoclusters in oxidizing ambients. While the nitrided oxide shell typically contains one to two percent of nitrogen, subsequent to the plasma nitridation 50 the nitrogen concentration near the surface of the nanoclusters can be as high as ten percent or slightly more. The high surface nitrogen content provides immunity against oxidation without degrading the interface between the silicon core and surrounding oxide.

Figure 14:
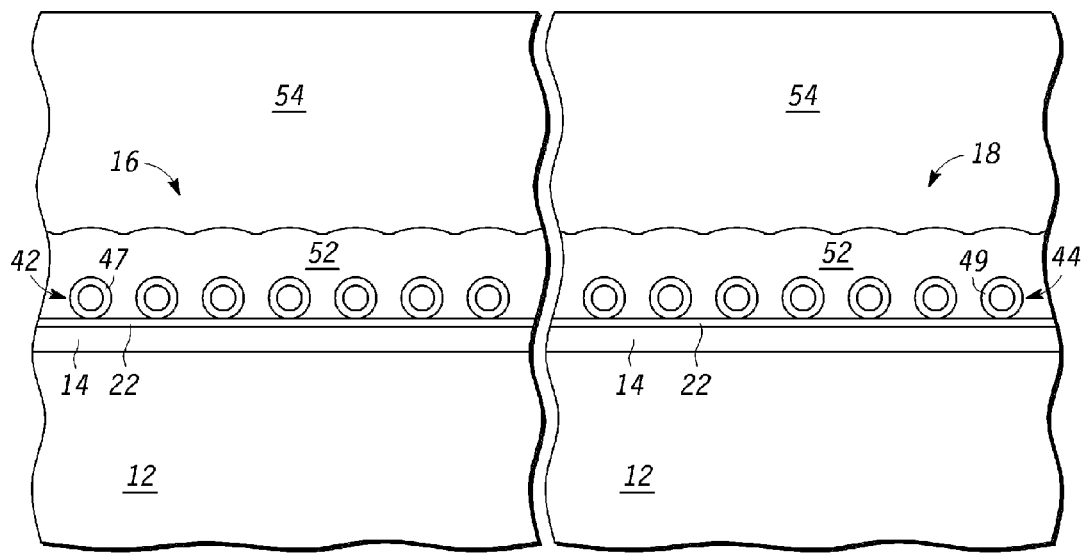

Illustrated in FIG. 14 is further processing of semiconductor device 10 of FIG. 11. A high temperature oxide (HTO) layer 52 is deposited to function as a control or blocking oxide layer. This HTO layer 52 is typically deposited in a low pressure CVD (Chemical Vapor Deposition) environment using silane or dichlorosilane as a precursor and a large excess of an oxidizing agent such as $N_2O$ at a temperature within a range of approximately seven hundred to eight hundred degrees Celsius. In the illustrated form the upper surface of the HTO layer 52 is conformal to the underlying nanoclusters. The nitrided shell around the nanoclusters protects the nanoclusters from being consumed during the control oxide deposition. Subsequent to the HTO deposition a thick layer of polysilicon 54 is deposited. This polysilicon 54 may be insitu doped or doped by ion implantation. This polysilicon 54 layer will be used to form the gate electrodes of transistors in the NVM region 16.

Figure 15:
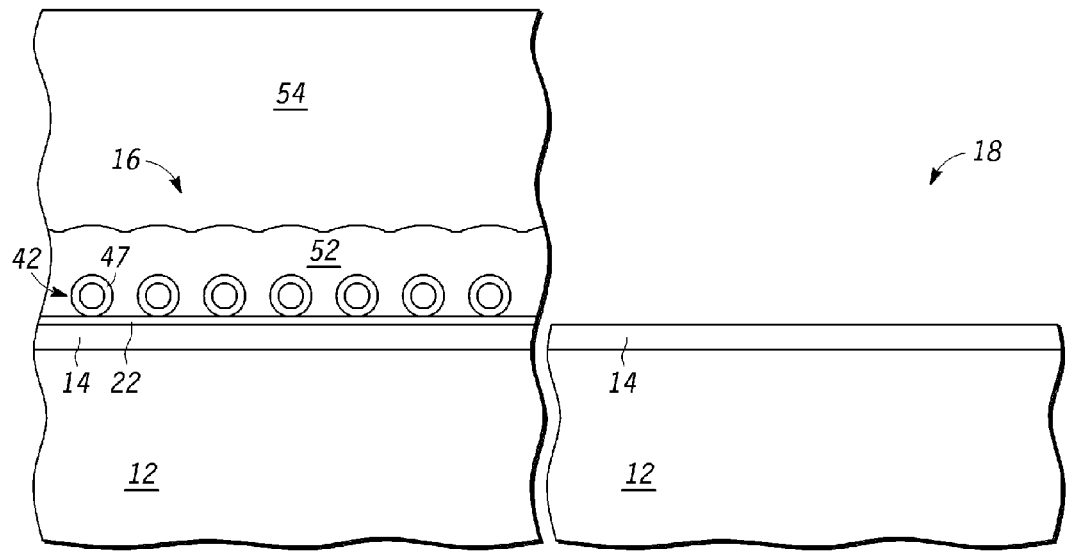

Illustrated in FIG. 15 is further processing of semiconductor device 10 of FIG. 11. The polysilicon 54, HTO layer 52 and plasma nitrided layer 22 are completely removed from the non-NVM region 18 by masking off the NVM region 16 with a mask (not shown). A combination of dry and wet etches can be readily applied. For example, the polysilicon 54 overlying the non-NVM region 18 is etched using conventional plasma or reactive ion etch (RIE) selective to oxide. The HTO layer 52 overlying the non-NVM region 18 can be removed by a wet chemistry such as dilute hydrofluoric acid. The plasma nitrided layer 22 serves as an etch stop layer during this etch step. During this wet etch step the nanoclusters 44 in the non-NVM region 18 are undercut and are floated off. To ensure complete removal of the nanoclusters, a clean using ammonium hydroxide, hydrogen peroxide and deionized water chemistry can be used in conjunction with megasonic action. The plasma nitrided layer 22 can be removed by a wet etch such as hot phosphoric acid. Subsequently the thin gate dielectric layer 14 can be removed with a wet etch without degrading the trench isolation oxide of isolation structures (not shown) in the non-NVM region 18.

Figure 16:
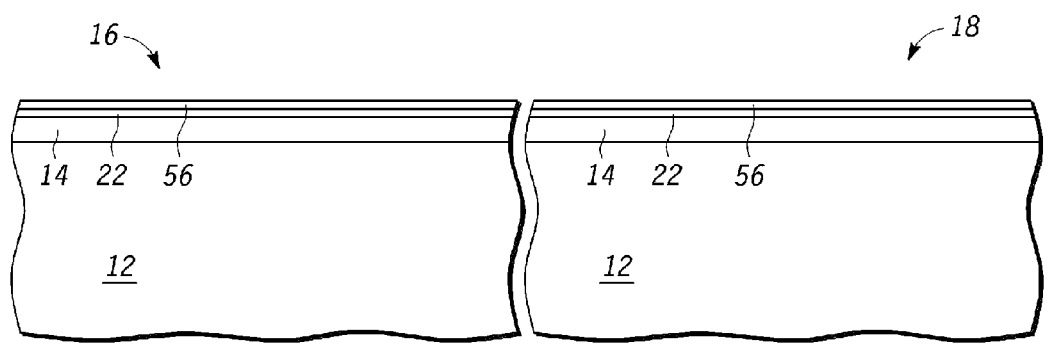
FIGS. 16-20 illustrate in cross-sectional form further processing from FIG. 2 of a semiconductor device in accordance with another form of the present invention.

Illustrated in FIG. 16 is alternate further processing of semiconductor device 10 after the processing performed through the end of FIG. 2. In particular, after the formation of the plasma nitrided layer 22, a layer of oxide 56 is deposited by, for example, low pressure CVD. This oxide 56 can be between approximately fifty to one hundred Angstroms in thickness and serves as a sacrificial layer during further processing described below. It should be understood that materials other than an oxide may be used in lieu of the oxide 56.

Figure 17:
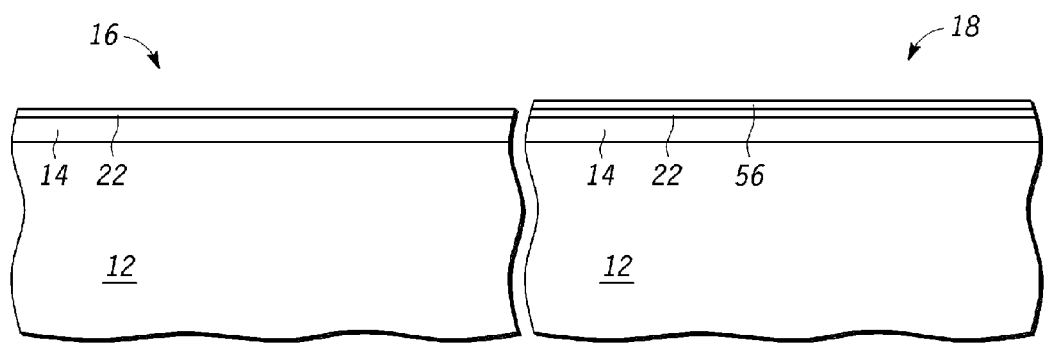

Illustrated in FIG. 17 is further processing of semiconductor device 10 after the processing of FIG. 16. In particular, the non-NVM region 18 is masked off by a mask (not shown) and the layer of oxide 56 is removed from the NVM region 16. In one form a wet etch using hydrofluoric acid selective to the underlying plasma nitrided layer 22 is used to remove the layer of oxide 56. The plasma nitrided layer 22 is important as an etch stop layer for the dilute hydrofluoric acid etch. At the end of the wet etch the layer of oxide 56 remains only in the non-NVM region 18 and is removed completely from the NVM region 16. Thus the layer of oxide 56 has functioned as a sacrificial layer.

Figure 18:
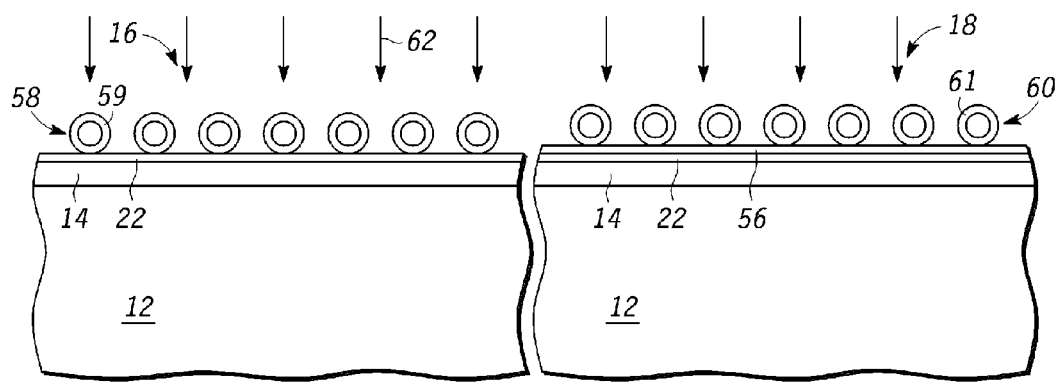

Illustrated in FIG. 18 is further processing of semiconductor device 10 after the processing of FIG. 17. A plurality of nanoclusters is formed directly on the plasma nitrided layer 22. In one form the nanoclusters are formed of silicon and are deposited using, for example, a precursor like silane or disilane in a temperature range of between four hundred fifty and six hundred fifty degrees Celsius in an LPCVD reactor. The NVM nanoclusters 58 are formed in the NVM region 16, and non-NVM nanoclusters 60 are formed in the non-NVM region 18. The nanoclusters are subjected to an oxidizing ambient containing nitrous oxide [NO] at around 800 to 900 degrees Celsius. This forms a thin oxide shell containing about two percent of nitrogen ($N_2$). The oxidation process of nanoclusters in an NO ambient is more self-limiting than that in oxygen ($O_2$). This process enables one to form a nitrided oxide shell that has a dimension of between ten and fifteen Angstroms. For example, a nitrided oxide layer 59 is formed in the NVM region 16 around one of the illustrated nanoclusters. Similarly, a nitrided oxide layer 61 is formed in the non-NVM region 18 around one of the illustrated nanoclusters. This nitrided oxide shell ensures that the interface between the core of the silicon nanocluster and the surrounding nitrided oxide has minimal surface state defects. The nitrogen in the nitrided oxide shell also protects the nanoclusters when they are exposed to oxidizing ambients during subsequent processing. The nanoclusters are then subjected to a plasma nitridation 62. The purpose of this nitridation is to increase the surface nitrogen concentration of the nitrided oxide layer 59 and 61 to about five to ten atomic percent. This nitrided oxide shell around the nanoclusters offers robust protection when they are exposed to oxidizing ambients during subsequent processing.

Figure 19:
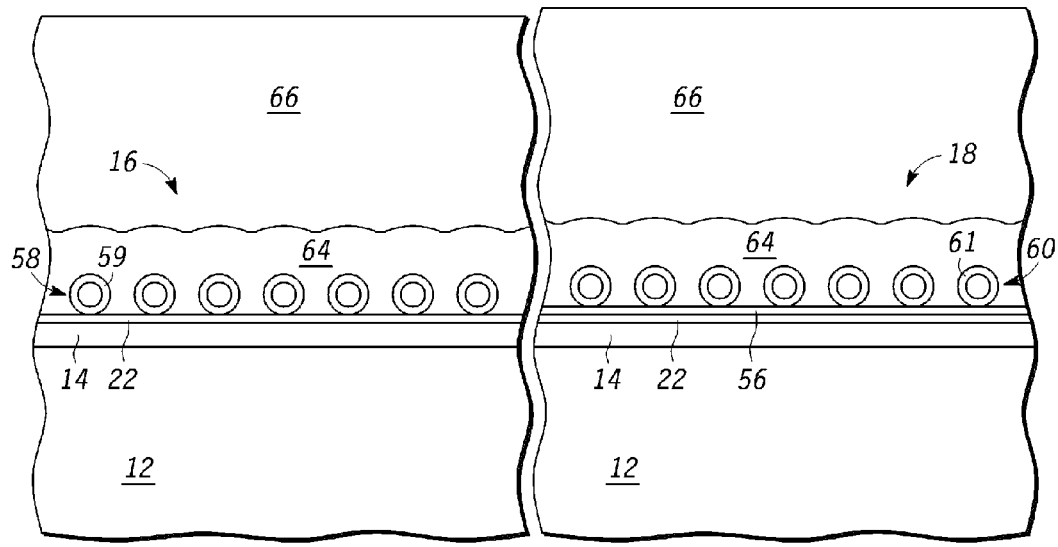

Illustrated in FIG. 19 is further processing of semiconductor device 10 after the processing of FIG. 18. A high temperature oxide (HTO) layer 64 is deposited to function as a control or blocking oxide layer. This HTO layer 64 is typically deposited in a low pressure CVD (Chemical Vapor Deposition) environment using silane or dichlorosilane as a precursor and a large excess of an oxidizing agent such as $N_2O$ at a temperature within a range of approximately seven hundred to eight hundred degrees Celsius. In the illustrated form the upper surface of the HTO layer 64 is conformal to the underlying nanoclusters. The nitrided shell around the nanoclusters protects the nanoclusters from being consumed during the control oxide deposition. Subsequent to the HTO deposition a thick layer of polysilicon 66 is deposited. This polysilicon 66 may be insitu doped or doped by ion implantation. This polysilicon 66 layer will be used to form the gate electrodes of transistors in the NVM region 16.

Figure 20:
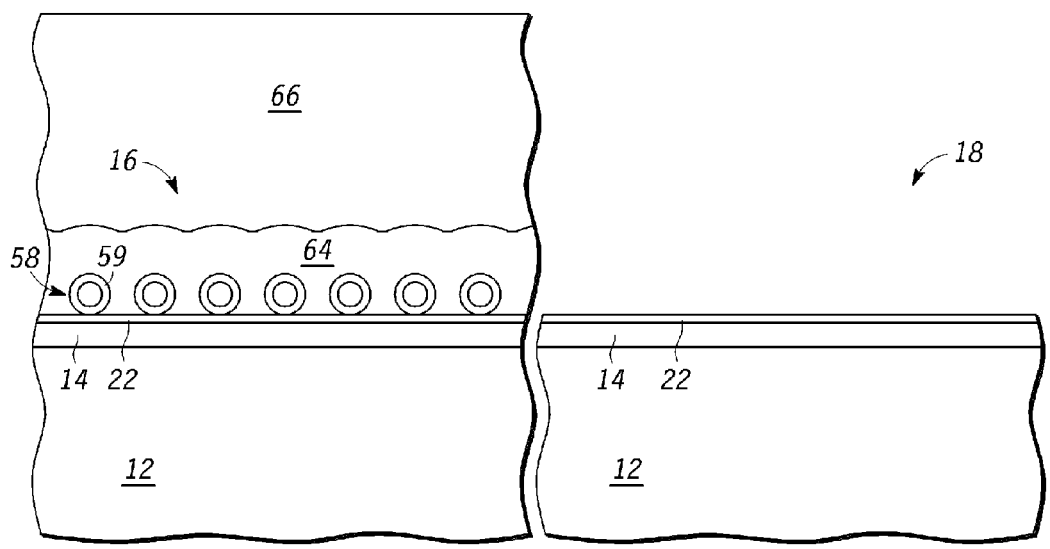

Illustrated in FIG. 20 is further processing of semiconductor device 10 after the processing of FIG. 19. The polysilicon 66, HTO layer 64 and layer of oxide 56 are completely removed from the non-NVM region 18 by masking off the NVM region 16 with a mask (not shown). A combination of dry and wet etches can be readily applied. For example, the polysilicon 66 overlying the non-NVM region 18 is etched using conventional plasma or reactive ion etch (RIE) selective to oxide. The HTO layer 64 and the layer of oxide 56 overlying the non-NVM region 18 can be removed by a wet chemistry such as dilute hydrofluoric acid. The plasma nitrided layer 22 serves as an etch stop layer during this etch step. During this wet etch step the nanoclusters in the non-NVM region 18 are undercut when the layer of oxide 56 is etched and are floated off. To ensure complete removal of the nanoclusters, a clean using ammonium hydroxide, hydrogen peroxide and deionized water chemistry can be used in conjunction with megasonic action. The plasma nitrided layer 22 can be removed by a wet etch such as hot phosphoric acid. Subsequently the thin gate dielectric layer 14 can be removed with a wet etch without degrading the trench isolation oxide of isolation structures (not shown) in the non-NVM region 18.

By now it should be apparent that there has been provided a method for efficiently removing previously formed nanoclusters from select areas of an integrated circuit. Additionally there has been provided a method for protecting nanoclusters from oxidation and other processing effects while retaining the desired electrical properties of the nanoclusters. By performing a plasma nitridation of low energy, nitrogen can be located close to the surface of the NVM tunnel oxide which underlies the nanoclusters. Further, the concentration of nitrogen is in the range of about five to ten atomic percent which is adequate to selectively etch the overlying layers but not high enough to introduce electrical defects in the oxide underlying the nanoclusters. Alternative methods of introducing nitrogen into the NVM tunnel oxide such as nitridation of the entire oxide underlying the nanoclusters is problematic because it is extremely difficult to achieve nitrogen concentrations higher than one or two atomic percent and extremely high temperatures that negatively affect the overall device characteristics are required. Further, nitridation of the entire oxide will not result in atomic nitrogen concentrations that are high enough to achieve the above objectives.

Further, plasma nitridation of a nitrided oxide surrounding nanoclusters functions to provide an oxidation barrier that is important to preserve the nanoclusters during subsequent processing involving oxidizing ambients. A nitrided oxide that is formed without a plasma nitridation is a thin nitrided oxide layer and offers limited protection to the nanoclusters because of low nitrogen levels of typically one to two atomic percent. However, a thin nitrided oxide layer surrounding the nanoclusters is desirable from a device perspective as it ensures that there are minimal surface defect states at the interface of the silicon core of the nanocluster and the nitrided oxide shell. The process of forming this nitrided oxide layer further contributes to make the nanocluster size distribution more uniform as larger nanoclusters form a thicker shell than smaller nanoclusters. Plasma nitridation of the nanoclusters increase the nitrogen concentration near the surface of the nitrided oxide shell to about five to ten atomic percent that is high enough to serve as an oxidation barrier but not high enough to degrade the electrical characteristics of the nanoclusters. Thus the methods described herein offer protection against oxidation while avoiding the introduction of electrically active surface states that are undesirable in device applications such as non-volatile memory. A thin layer of a nitrided oxide around the silicon nanoclusters ensures that silicon nanocluster surface states are minimal. Thus the oxide around each of the nanoclusters minimizes the presence of charge traps on the nanocluster.

In one form there is provided a method of making a semiconductor device by providing a substrate having a semiconductor layer having a first portion for non-volatile memory and a second portion exclusive of the first portion. A first dielectric layer is formed over the semiconductor layer. A first plurality of nanoclusters is formed over the first portion and a second plurality of nanoclusters is formed over the second portion. A layer of nitrided oxide is formed around each nanocluster of the first plurality and the second plurality of nanoclusters. A remote plasma nitridation is performed on the layers of nitrided oxide of the first nanoclusters. The second plurality of nanoclusters is removed. A second dielectric layer is formed over the semiconductor layer and a conductive layer is formed over the second dielectric layer. In one form the remote plasma nitridation occurs after removal of the second plurality of nanoclusters. In another form the removal of the second plurality of nanoclusters occurs prior to forming the second dielectric layer. In yet another form a decoupled plasma nitridation is performed on the first dielectric layer. In yet another form an etch through the second dielectric layer and the conductive layer over the second portion is implemented prior to removing the second plurality of nanoclusters. In another form the remote plasma nitridation is also applied on the layers of nitrided oxide of the second nanoclusters. In yet another form removal of the second plurality of nanoclusters is performed by a lift-off process. In yet another form a decoupled plasma nitridation is performed on the first dielectric layer. In yet another form the second dielectric layer is oxide and the conductive layer is polysilicon. In yet another form a sacrificial layer is formed over the first dielectric prior to forming the first plurality and second plurality of nanoclusters. In another form the sacrificial layer is removed over the second portion as part of the lift-off process.

In yet another form there is provided a method of forming a semiconductor device. A substrate is provided having a semiconductor layer having a first portion for non-volatile memory and a second portion exclusive of the first portion. A tunnel dielectric layer is formed on the semiconductor layer. A first plurality of nanoclusters is formed over the first portion and a second plurality of nanoclusters is formed over the second portion. A layer of nitrided oxide is formed around each nanocluster of the first plurality and the second plurality of nanoclusters. A remote plasma nitridation is performed on the layers of nitrided oxide of the first plurality of nanoclusters. The second plurality of nanoclusters is removed. A control dielectric layer is formed over the semiconductor layer. A gate layer is formed over the control dielectric layer. In another form a decoupled plasma nitridation is performed on the tunnel dielectric layer to cause formation of a layer in the tunnel dielectric layer having a concentration of nitrogen of at least five percent. In yet another form the layer in the tunnel dielectric layer functions as an etch stop layer during the step of removing the second plurality of nanoclusters. In a further form a sacrificial layer is formed over the tunnel dielectric layer prior to forming the first and second plurality of nanoclusters, wherein the removing is implemented by masking the first portion and etching the sacrificial layer over the second portion after forming the second plurality of nanoclusters on the sacrificial layer. In yet another form the sacrificial layer is an oxide layer formed by thermal oxidation. In a further form the remote plasma nitridation is also being applied on the layers of nitrided oxide of the second nanoclusters. In a further form the control dielectric is an oxide and the gate conductor is polysilicon. In one form the removing occurs prior to performing the remote plasma nitridation.

In another form there is provided a method of forming a semiconductor device. A substrate is provided having a semiconductor layer having a first portion for non-volatile memory and a second portion exclusive of the first portion. A tunnel dielectric layer is formed on the semiconductor layer. A dielectric layer is formed over the tunnel dielectric. A first plurality of nanoclusters is formed over the first portion and a second plurality of nanoclusters is formed over the second portion. A layer of nitrided oxide is formed around each nanocluster of the first plurality and the second plurality of nanoclusters. The second plurality of nanoclusters is removed by etching the dielectric layer over the second portion. Remote plasma nitridation is performed on the layers of nitrided oxide of the first plurality of nanoclusters. A control dielectric layer is formed over the semiconductor layer. A gate layer is formed over the control dielectric layer. In one form the forming of the dielectric layer is by thermal oxidation of a top portion of the tunnel dielectric and is further implemented by performing a decoupled plasma nitridation on the tunnel dielectric layer to cause formation of a layer in the tunnel dielectric layer having a concentration of nitrogen of at least five percent.

In one form performing the decoupled plasma nitridation occurs prior to forming the dielectric layer. Removing the second plurality of nanoclusters is further implemented by using the layer in the tunnel dielectric as an etch stop.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. A method of making a semiconductor device, comprising:
   providing a substrate having a semiconductor layer having a first portion for non-volatile memory and a second portion exclusive of the first portion;
   forming a first dielectric layer over the semiconductor layer;
   forming a first plurality of nanoclusters over the first portion and a second plurality of nanoclusters over the second portion;
   forming a layer of nitrided oxide around each nanocluster of the first plurality of nanoclusters and the second plurality of nanoclusters;
   removing the second plurality of nanoclusters;
   performing a step of remote plasma nitridation on each layer of nitrided oxide around the first plurality of nanoclusters after removing the second plurality of nanoclusters;
   forming a second dielectric layer over the semiconductor layer; and
   forming a conductive layer over the second dielectric layer.

2. The method of claim 1, further comprising forming the conductive layer as a polysilicon layer and forming the second dielectric layer as an oxide layer.

3. The method of claim 2, wherein removing the second plurality of nanoclusters occurs prior to forming the second dielectric layer.

4. The method of claim 3, further comprising performing a step of decoupled plasma nitridation on the first dielectric layer.

5. The method of claim 1, further comprising etching through the second dielectric layer and the conductive layer over the second portion prior to the step of removing the second plurality of nanoclusters.

6. The method of claim 5, wherein the performing the step of remote plasma nitridation is further characterized as also being applied on each layer of nitrided oxide around the second plurality of nanoclusters.

7. The method of claim 6, wherein the step of removing the second plurality of nanoclusters is further characterized as being by a lift-off process.

8. The method of claim 7, further comprising performing a step of decoupled plasma nitridation on the first dielectric layer.

9. The method of claim 8, wherein the second dielectric layer comprises oxide and the conductive layer comprises polysilicon.

10. The method of claim 7, further comprising:
    forming a sacrificial layer over the first dielectric layer prior to forming the first plurality of nanoclusters and the second plurality of nanoclusters; and
    removing the sacrificial layer over the second portion as part of the lift-off process.

11. A method of forming a semiconductor device, comprising:
    providing a substrate having a semiconductor layer having a first portion for non-volatile memory and a second portion exclusive of the first portion;
    forming a tunnel dielectric layer on the semiconductor layer;
    forming a first plurality of nanoclusters over the first portion and a second plurality of nanoclusters over the second portion;
    forming a layer of nitrided oxide around each nanocluster of the first plurality of nanoclusters and the second plurality of nanoclusters; and
    removing the second plurality of nanoclusters prior to performing a step of remote plasma nitridation on each layer of nitrided oxide around the first plurality of nanoclusters;
    forming a control dielectric layer over the semiconductor layer; and
    forming a gate layer over the control dielectric layer.

12. The method of claim 11, further comprising performance of a step of decoupled plasma nitridation on the tunnel dielectric layer to cause formation of a layer in the tunnel dielectric layer having a concentration of nitrogen of at least five percent.

13. The method of claim 12, wherein the layer in the tunnel dielectric layer functions as an etch stop layer during the step of removing the second plurality of nanoclusters.

14. The method of claim 11, further comprising:
    forming a sacrificial layer over the tunnel dielectric layer prior to forming the first plurality of nanoclusters and the second plurality of nanoclusters, wherein the step of removing comprises masking the first portion and etching the sacrificial layer over the second portion after forming the second plurality of nanoclusters on the sacrificial layer.

15. The method of claim 14, wherein the sacrificial layer is an oxide layer formed by thermal oxidation.

16. The method of claim 11, wherein the performing the step of remote plasma nitridation is further characterized as also being applied on each layer of nitrided oxide around the plurality of second nanoclusters.

17. The method of claim 11 wherein the control dielectric layer comprises oxide and the gate layer comprises polysilicon.

18. The method of claim 11, wherein the step of removing the second plurality of nanoclusters occurs prior to forming the control dielectric layer.

19. A method of forming a semiconductor device, comprising the sequential steps of:

providing a substrate having a semiconductor layer having a first portion for non-volatile memory and a second portion exclusive of the first portion;

forming a first plurality of nanoclusters over the first portion and a second plurality of nanoclusters over the second portion;

removing the second plurality of nanoclusters over the second portion;

forming a layer of nitrided oxide around each nanocluster of the first plurality of nanoclusters;

forming a control dielectric layer over the semiconductor layer; and forming a gate layer over the control dielectric layer.

* * * * *